United States Patent
Horibe et al.

(10) Patent No.: US 12,300,614 B2
(45) Date of Patent: May 13, 2025

(54) SEMICONDUCTOR DEVICE WITH MULTILAYER INSULATING LAYER IN RECESS AND METHOD OF MANUFACTURING THE SAME

(71) Applicant: Kioxia Corporation, Tokyo (JP)

(72) Inventors: Kosuke Horibe, Yokkaichi Mie (JP); Kei Watanabe, Yokkaichi Mie (JP); Shinya Okuda, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 917 days.

(21) Appl. No.: 17/471,059

(22) Filed: Sep. 9, 2021

(65) Prior Publication Data
US 2022/0293529 A1 Sep. 15, 2022

(30) Foreign Application Priority Data
Mar. 15, 2021 (JP) .................................. 2021-041119

(51) Int. Cl.
| | |
|---|---|
| *H01L 23/532* | (2006.01) |
| *H01L 21/02* | (2006.01) |
| *H01L 21/768* | (2006.01) |
| *H01L 23/522* | (2006.01) |
| *H10B 43/27* | (2023.01) |

(52) U.S. Cl.
CPC .. *H01L 23/53295* (2013.01); *H01L 21/76801* (2013.01); *H10B 43/27* (2023.02); *H01L 21/02126* (2013.01); *H01L 21/02211* (2013.01); *H01L 21/02216* (2013.01); *H01L 21/02274* (2013.01); *H01L 23/5226* (2013.01)

(58) Field of Classification Search
CPC ........ H01L 23/53295; H01L 21/02126; H10B 41/50; H10B 43/50; H10B 43/27; H10B 41/27
See application file for complete search history.

(56) References Cited

U.S. PATENT DOCUMENTS

| | | | |
|---|---|---|---|
| 9,741,573 B2 | 8/2017 | Yu | |
| 10,580,690 B2 | 3/2020 | Yu et al. | |
| 2010/0006940 A1* | 1/2010 | Kakehata | H01L 29/0649 257/506 |
| 2017/0077122 A1* | 3/2017 | Ono | H10B 43/27 |
| 2018/0330985 A1 | 11/2018 | Yu et al. | |
| 2019/0304775 A1 | 10/2019 | Li et al. | |
| 2021/0210499 A1* | 7/2021 | Jhothiraman | H10B 41/10 |

* cited by examiner

*Primary Examiner* — John P. Dulka
(74) *Attorney, Agent, or Firm* — Holtz, Holtz & Volek PC

(57) ABSTRACT

A semiconductor device includes: a stacking part in which the plurality of conductor layers are separately stacked in a z direction; a stair part that is arranged alongside the stacking part in a y direction and in which the plurality of conductor layers are extended in the y direction in a stair shape; a first insulating film covering at least part of the stair part; a second insulating film covering at least part of the first insulating film and different from the first insulating film; and a contact connected with one of the plurality of conductor layers and penetrating through the first insulating film and the second insulating film. The linear expansion coefficient of the second insulating film is larger than the linear expansion coefficient of the first insulating film.

13 Claims, 12 Drawing Sheets

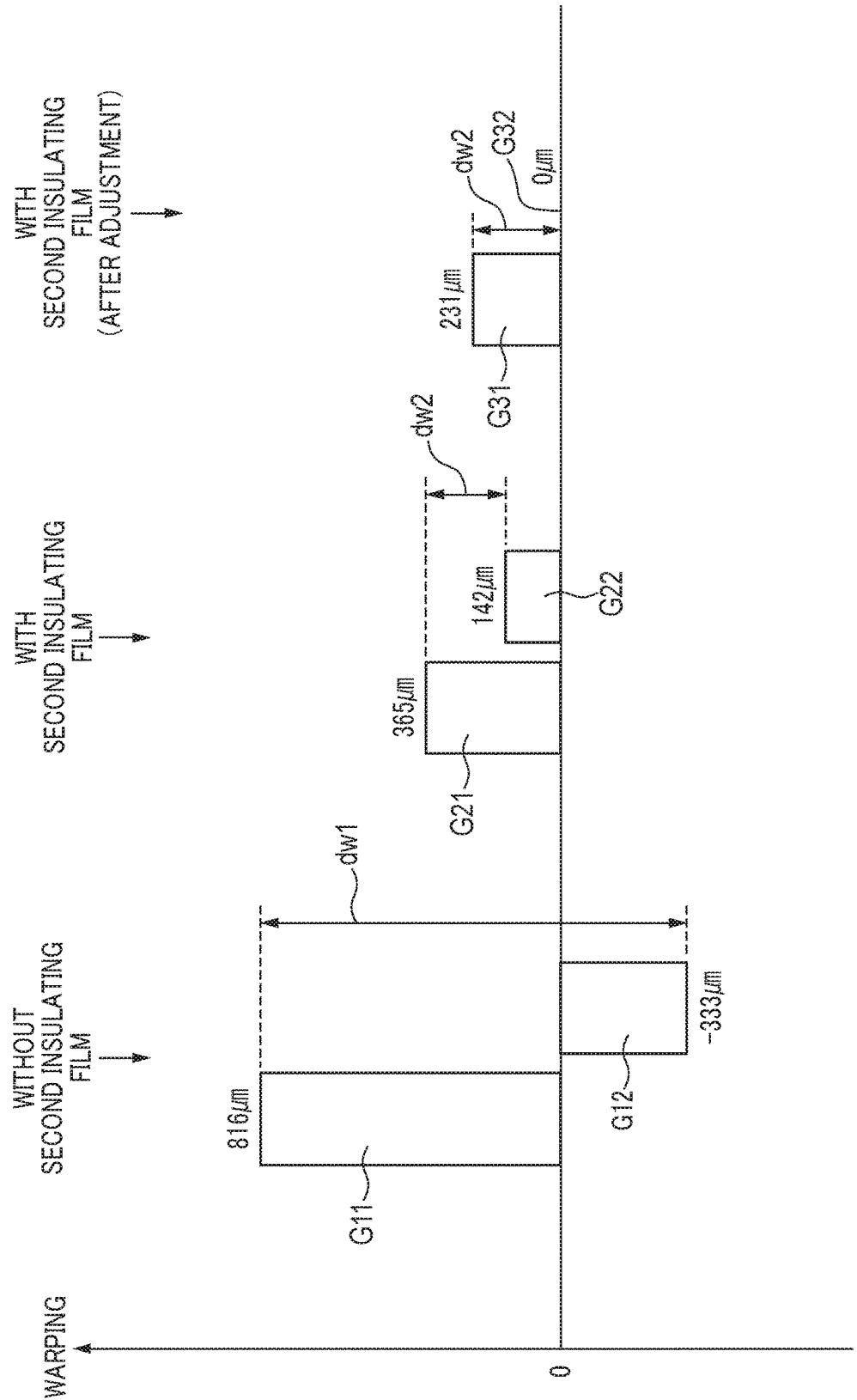

SEMICONDUCTOR DEVICE WITH MULTILAYER INSULATING LAYER IN RECESS AND METHOD OF MANUFACTURING THE SAME

BACKGROUND OF THE INVENTION

Field of the Invention

An embodiment of the present invention relates to a semiconductor device and a method of manufacturing the same.

Description of the Related Art

A semiconductor device such as a NAND flash memory includes a stacking part in which a plurality of conductor layers are stacked, and a stair part in which the conductor layers of the stacking part are extended in a stair shape. The stair part is covered by an insulator layer made of, for example, oxide silicon.
Patent Literature 1: US Patent Application Publication No. 2018/0330985

SUMMARY OF THE INVENTION

In such a semiconductor device, warping potentially occurs to a semiconductor substrate due to the difference between the linear expansion coefficient of the insulator layer covering the stair part and the linear expansion coefficient of the semiconductor substrate.

A disclosed embodiment provide a semiconductor device that can prevent warping of a semiconductor substrate and a method of manufacturing the semiconductor device.

A semiconductor device according to an embodiment includes: a stacking part in which a plurality of conductor layers are separately stacked in a first direction; a stair part that is arranged alongside the stacking part in a second direction intersecting the first direction and in which the plurality of conductor layers are extended in the second direction in a stair shape; a first insulating film covering at least part of the stair part; a second insulating film covering at least part of the first insulating film and different from the first insulating film; and a first contact connected with one of the plurality of conductor layers and penetrating through the first insulating film and the second insulating film. A linear expansion coefficient of the second insulating film is larger than a linear expansion coefficient of the first insulating film.

BRIEF DESCRIPTION OF THE DRAWINGS

FIG. 11 is a diagram for description of semiconductor substrate warping; and

DETAILED DESCRIPTION OF THE PREFERRED EMBODIMENT

Figure 1:
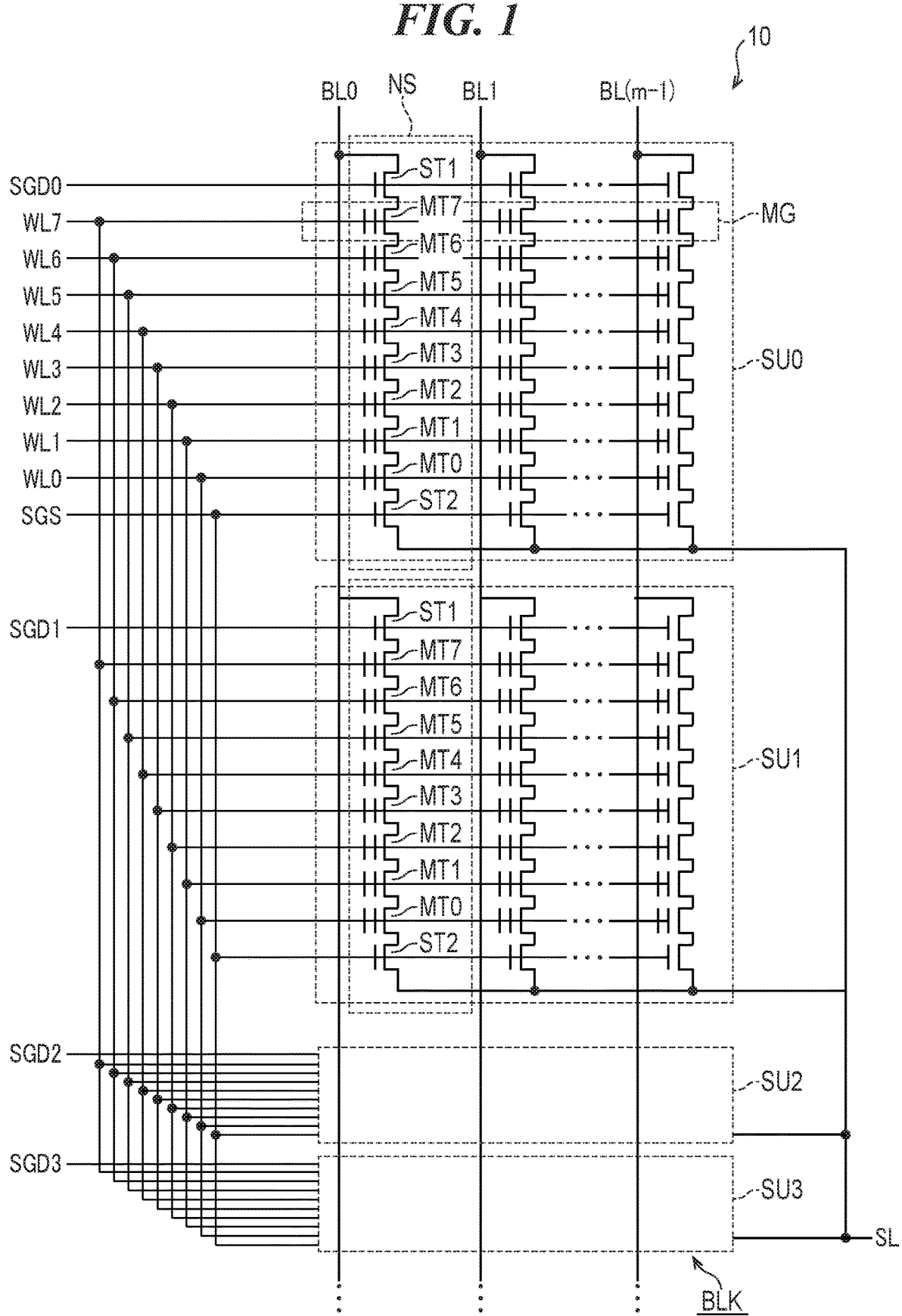
FIG. 1 is an equivalent circuit diagram illustrating the configuration of a semiconductor device according to the present embodiment.

The present embodiment will be described below with reference to the accompanying drawings. To facilitate understanding of the description, any same component in the drawings is denoted by the same reference sign when possible, and duplicate description thereof is omitted.

A first embodiment will be described below. A semiconductor device 10 according to the present embodiment is a non-volatile storage device configured as, for example, a NAND flash memory. FIG. 1 illustrates an equivalent circuit diagram of the configuration of the semiconductor device 10. The semiconductor device 10 includes a plurality of blocks BLK, but only one of the blocks BLK is illustrated in FIG. 1. The configuration of any other block BLK included in the semiconductor device 10 is same as that illustrated in FIG. 1.

As illustrated in FIG. 1, the block BLK includes, for example, four string units SU (SU0 to SU3). Each string unit SU includes a plurality of NAND strings NS. Each NAND string NS includes, for example, eight memory cell transistors MT (MT0 to MT7) and selection transistors ST1 and ST2.

The number of memory cell transistors MT is not limited to eight but may be, for example, 32, 48, 64, or 96. For example, for cutoff characteristic improvement, the selection transistors ST1 and ST2 may be each configured as a plurality of transistors instead of a single transistor. In addition, a dummy cell transistor may be provided between the memory cell transistors MT and the selection transistors ST1 and ST2.

The memory cell transistors MT are disposed and connected in series with each other between the selection transistor ST1 and the selection transistor ST2. The memory cell transistor MT7 on one end side is connected with the source of the selection transistor ST1, and the memory cell transistor MT0 on the other end side is connected with the drain of the selection transistor ST2.

The gates of the selection transistors ST1 of each of the string units SU0 to SU3 are connected in common with the corresponding one of select gate lines SGD0 to SGD3, respectively. The gates of the selection transistors ST2 are connected in common with the same select gate line SGS among the plurality of string units SU in the same block BLK. The control gates of the memory cell transistors MT0 to MT7 in the same block BLK are connected in common with word lines WL0 to WL7, respectively. In other words, the word lines WL0 to WL7 and the select gate line SGS are common among the plurality of string units SU0 to SU3 in the same block BLK, but the select gate lines SGD are individually provided for the respective string units SU0 to SU3 in the same block BLK.

The semiconductor device 10 is provided with m bit lines BL (BL0, BL1, . . . , BL (m−1)). The above-described "m" is an integer that indicates the number of NAND strings NS included in one string unit SU. The drain of the selection transistor ST1 in each NAND string NS is connected with the corresponding bit line BL. The source of the selection transistor ST2 is connected with a source line SL. The source line SL is connected in common with the sources of the plurality of selection transistors ST2 included in the block BLK.

Data stored in the plurality of memory cell transistors MT in the same block BLK is deleted all at once. Data reading and writing are performed all at once for a plurality of memory cell transistors MT connected with one word line WL and belonging to one string unit SU. Each memory cell can hold 3-bit data made of a higher-order bit, a middle-order bit, and a lower-order bit.

Accordingly, the semiconductor device 10 according to the present embodiment employs a TLC scheme of storing 3-bit data in each memory cell transistor MT as the scheme of data writing to memory cell transistors MT. Instead of such an aspect, an MLC scheme of storing 2-bit data in each memory cell transistor MT, an SLC scheme of storing 1-bit data in each memory cell transistor MT, or the like may be employed as the scheme of data writing to memory cell transistors MT.

A set of 1-bit data stored in a plurality of memory cell transistors MT connected with one word line WL and belonging to one string unit SU is referred to as a "page". In FIG. 1, one set of a plurality of memory cell transistors MT as described above is denoted by a reference sign "MG".

When 3-bit data is stored in each memory cell transistor MT as in the present embodiment, a set of a plurality of memory cell transistors MT connected with a common word line WL in one string unit SU can store 3-page data.

Figure 2:
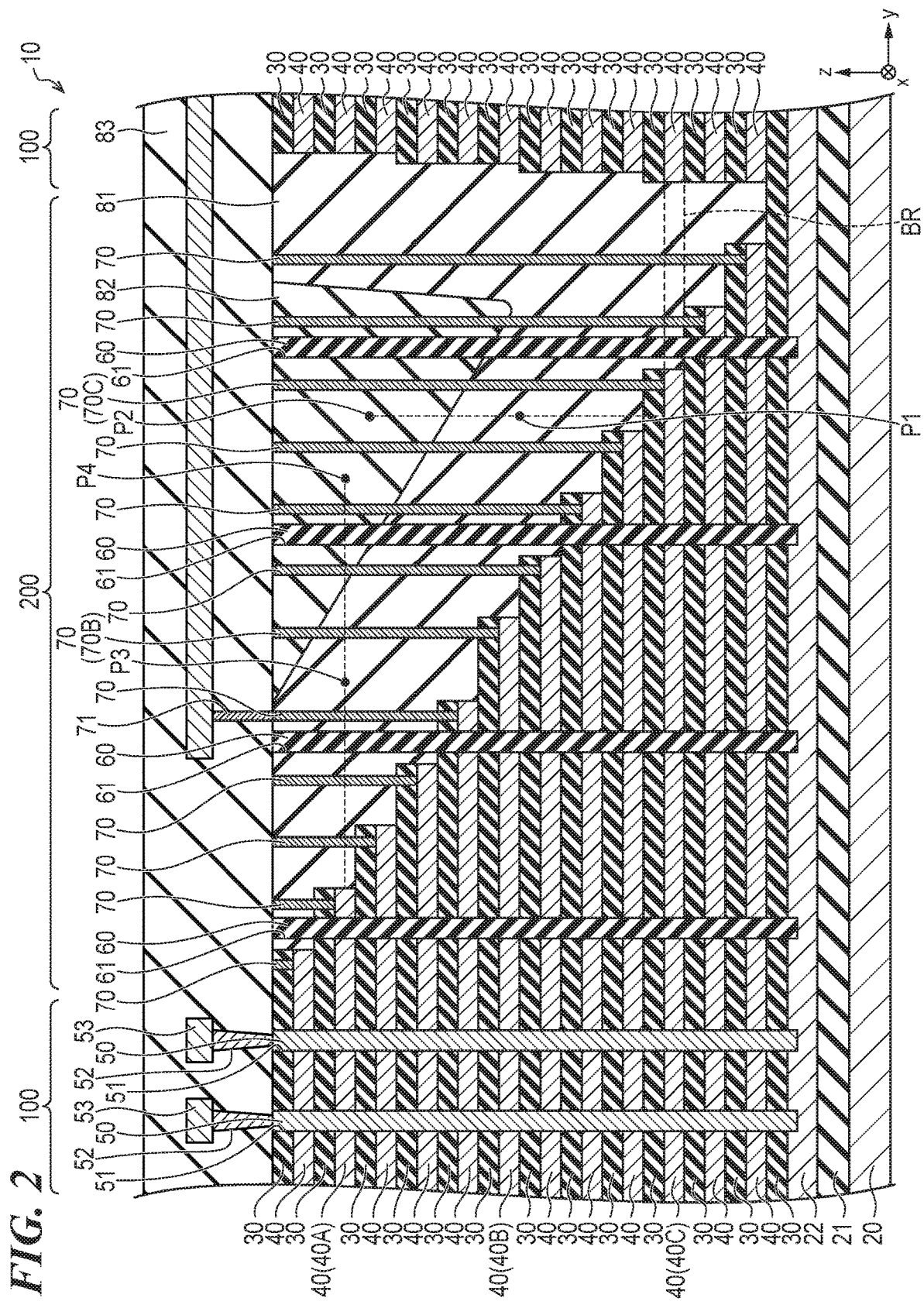
FIG. 2 is a cross-sectional view illustrating the configuration of the semiconductor device according to the present embodiment.

FIG. 2 illustrates a specific configuration of the semiconductor device 10, which is expressed with an equivalent circuit in FIG. 1. As illustrated in FIG. 2, the semiconductor device 10 includes a semiconductor substrate 20, an insulator layer 21, a conductor layer 22, and a plurality of insulator layers 30 and conductor layers 40.

The semiconductor substrate 20 is a plate member having a flat surface on the upper side in FIG. 2, and is, for example, a silicon wafer. The insulator layer 21, the conductor layer 22, the insulator layers 30, the conductor layers 40, and the like describes below are a plurality of layered films formed by, for example, CVD deposition on the upper surface side of the semiconductor substrate 20. The semiconductor substrate 20 has a disk shape when the above-described CVD deposition is performed. The semiconductor substrate 20 as a disk-shaped silicon wafer is formed so that a plurality of semiconductor devices 10 in FIG. 2 are arranged on the surface of the semiconductor substrate 20, and then is cut into each semiconductor device 10 as a chip.

In FIG. 2, a z direction is defined to be a direction orthogonal to the surface of the semiconductor substrate 20 and pointing from the lower side toward the upper side in FIG. 2, and a z axis is defined to extend in the z direction. A y direction is defined to be a direction orthogonal to the z direction and pointing from the left side toward the right side in FIG. 2, and a y axis is defined to extend in the y direction. An x direction is defined to be a direction orthogonal to the z and y directions and pointing from the near side of the sheet of FIG. 2 to the far side, and an x axis is defined to extend in the x direction. Hereinafter, the directions and axes defined in this manner are used as appropriate to describe the configuration of the semiconductor device 10.

The insulator layer 21 is formed of an insulating material such as oxide silicon. Peripheral circuits (not illustrated) for performing data reading, writing, and deletion at the memory cell transistors MT in FIG. 1 are formed on the upper surface of the semiconductor substrate 20. The insulator layer 21 entirely covers the peripheral circuits and prevents conduction of the peripheral circuits with the conductor layer 22.

The conductor layer 22 functions as the source line SL. The conductor layer 22 is formed of, for example, a silicon-containing material such as polycrystalline silicon doped with impurities or metal silicide, or a stacked structure of such a silicon-containing material and a metallic material. The conductor layer 22 is formed in a plate shape that covers the upper surface of the above-described insulator layer 21 from the z direction side.

The plurality of insulator layers 30 and the plurality of conductor layers 40 are each formed and are alternately formed covering part of the conductor layer 22 from the upper side. The number of stacked insulator layers 30 and conductor layers 40 in FIG. 2 is different from the actual number. The conductor layers 40 are stacked in the z direction and separated from each other in the direction. The z direction, in which the plurality of conductor layers 40 are stacked, corresponds to a "first direction" in the present embodiment.

Each conductor layer 40 is a conductive layer formed of a material containing, for example, tungsten. In the conductor layer 40, the outer peripheral surface of the material containing, for example, tungsten may be covered by a barrier metal material such as titanium nitride. Each conductor layer 40 is used as any of the word lines WL0 to WL7, select gate lines SGS0 and SGD0, and the like in FIG. 1. Each insulator layer 30 is disposed between conductor layers 40 adjacent to each other in the z direction and provides electrical insulation between both layers. Each insulator layer 30 is formed of, for example, a material containing oxide silicon.

As illustrated in FIG. 2, a plurality of memory pillars 50 are formed in a region where the plurality of insulator layers 30 and conductor layers 40 are stacked in the z direction, and the memory pillars 50 penetrate these layers in the z direction. Each memory pillar 50 is formed in a range from an insulator layer 30 closest to the z direction side to the conductor layer 22. Each memory pillar 50 corresponds to a NAND string SR illustrated in FIG. 1. The number of memory pillars 50 in FIG. 2 is different from the actual number.

Figure 3:
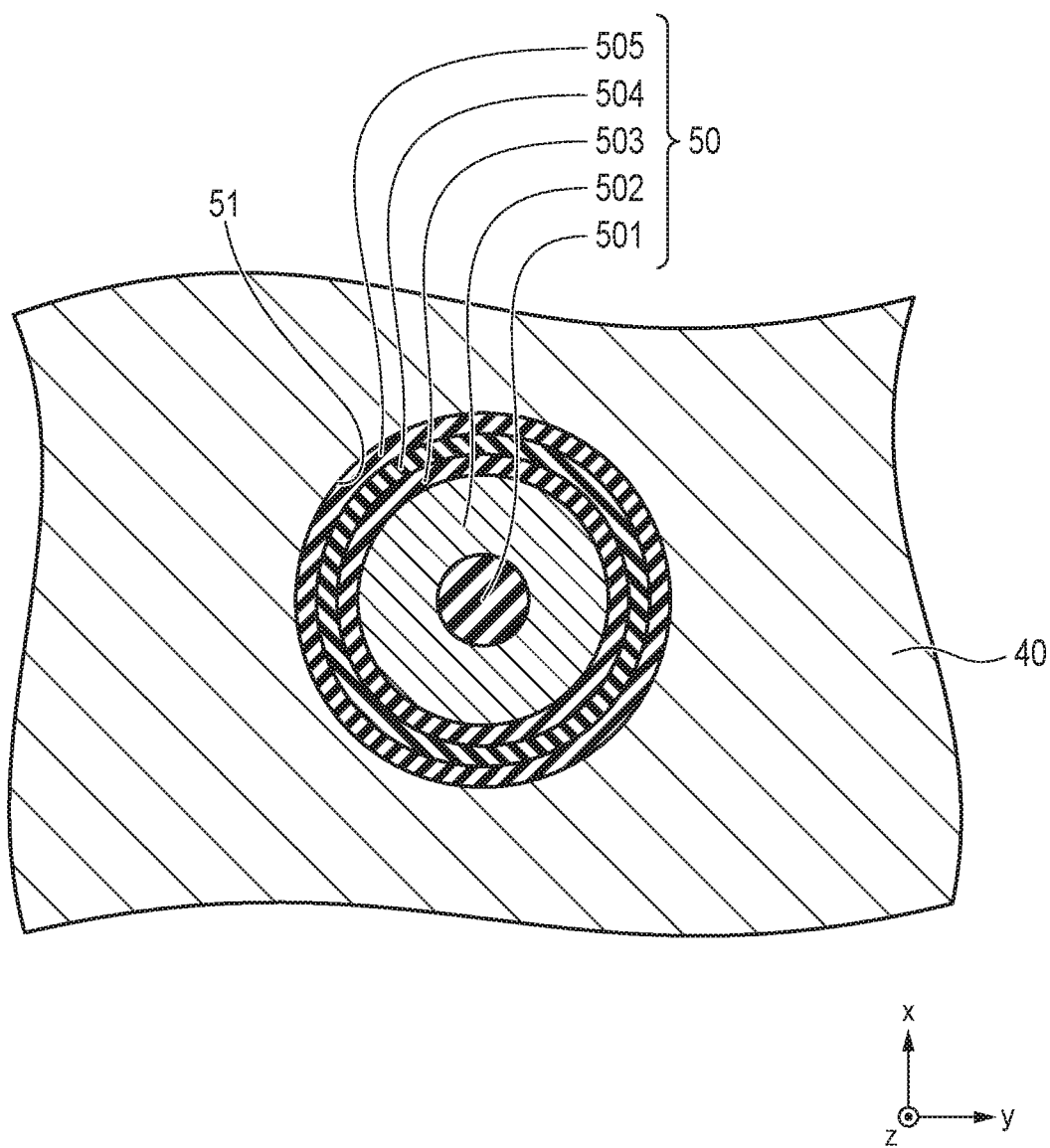
FIG. 3 is a cross-sectional view illustrating the configuration of the semiconductor device according to the present embodiment.

FIG. 3 schematically illustrates a cross section of each memory pillar 50 taken along a surface orthogonal to the z axis. As illustrated in FIG. 3, each memory pillar 50 includes a semiconductor 502, a tunnel insulating film 503, an electric charge accumulation film 504, and a block insulating film 505.

The semiconductor 502 has a tubular shape extending in the z direction in a part in which the plurality of insulator layers 30 and conductor layers 40 are stacked, and is formed of a silicon material such as amorphous silicon or polysilicon. A core 501 made of an insulating material is formed inside the tubular semiconductor 502. Instead of such an aspect, an aspect in which no core 501 is formed inside the semiconductor 502 may be used.

The tunnel insulating film 503 covers the outer peripheral surface of the semiconductor 502. The tunnel insulating film 503 is formed of, for example, a material containing oxide silicon. The electric charge accumulation film 504 covers the outer peripheral surface of the tunnel insulating film 503. The electric charge accumulation film 504 is formed of, for example, a material containing silicon nitride. The block insulating film 505 covers the outer peripheral surface of the electric charge accumulation film 504. The block insulating film 505 is formed of, for example, oxide silicon, or a material containing metallic oxide having a dielectric constant larger than that of oxide silicon. The outer peripheral surface of the block insulating film 505 formed outermost is surrounded by each stacked conductor layer 40.

Transistors are formed at parts where each memory pillar 50 faces the plurality of conductor layers 40 through the block insulating film 505, the electric charge accumulation film 504, and the tunnel insulating film 503. In other words, at each memory pillar 50, a plurality of transistors are connected in series in the longitudinal direction of the memory pillar 50. Each conductor layer 40 functions as the gate of the corresponding transistor. The semiconductor 502 inside each conductor layer 40 functions as the channel of the corresponding transistor.

Some of the transistors arranged in series as described above in the longitudinal direction of each memory pillar 50 function as the plurality of memory cell transistors MT in FIG. 1. Transistors formed at, for example, both end parts of the plurality of memory cell transistors MT arranged in series function as the selection transistors ST1 and ST2 in FIG. 1.

The block insulating film 505 and the like are removed at an end part of each memory pillar 50 on the negative z direction side, and the semiconductor 502 on the inner side is connected with the conductor layer 22. Accordingly, the conductor layer 22, which functions as the source line SL, is electrically connected with the channel of each transistor. At an end part of each memory pillar 50 on the z direction side, the semiconductor 502 is connected with a wire 53 through a contact 52. The wire 53 functions as a bit line BL.

Various publicly known aspects may be employed for the configuration and specific operation of each peripheral circuit for achieving, for example, data reading and writing at the memory cell transistors MT. Thus, further specific description is omitted.

In FIG. 2, reference sign "100" is provided to a part in which the plurality of conductor layers 40 are stacked in substantially identical plate shapes to cover the semiconductor substrate 20 and the plurality of memory pillars 50 are formed penetrating through the conductor layers 40. Hereinafter, such a part is also referred to as a "stacking part 100". The stacking part 100 is a part in which the plurality of memory cell transistors MT for storing data are formed, and is referred to as a "memory cell array", an "array region", or the like.

Two stacking parts 100 arranged in the y direction are illustrated in FIG. 2. In the stacking part 100 on the y direction side as well as the stacking part 100 on the negative y direction side, the plurality of conductor layers 40 are stacked in the z direction, and the plurality of memory pillars 50 are formed penetrating through each conductor layer 40. However, FIG. 2 omits illustration of the memory pillars 50 in the stacking part 100 on the y direction side.

As illustrated in FIG. 2, the insulator layers 30 and the conductor layers 40 are formed in a stair shape at a position adjacent to the stacking parts 100 in the y direction, in other words, at a part between the two stacking parts 100. In this region, since the conductor layers 40 are formed in a stair shape, a part (terrace part) of each conductor layer 40 is exposed on the z direction side without blocking by another conductor layer 40. Each conductor layer 40 exposed in this manner is connected with an end part of a contact 70 on the negative z direction side, the contact 70 extending in the z direction. As illustrated in FIG. 2, a plurality of the contacts 70 are provided. Each contact 70 is connected with any one of the plurality of conductor layers 40.

Each contact 70 is a column-shaped member formed of a conductive material such as tungsten. An end part of each contact 70 on the z direction side is connected with a wire 72 through a contact 71. The wire 72 is a wire for applying voltage to each conductor layer 40. The contact 71 and the wire 72 are individually provided for each contact 70, but only one pair of them is illustrated in FIG. 2.

The conductor layers 40 formed in a stair shape are directly connected with the respective conductor layers 40 of the stacking part 100 on the negative y direction side. The conductor layers 40 formed in a stair shape are electrically connected with the conductor layers 40 of the stacking part 100 on the y direction side through a bridge part BR formed extending in the y direction on the far side or near side of the sheet. In FIG. 2, only one of a plurality of the bridge parts BR arranged in the z direction is illustrated with a dotted line.

In this manner, each conductor layer 40 formed in a stair shape is electrically connected with a conductor layer 40 at the same height position (z coordinate) among the conductor layers 40 stacked in the stacking part 100. With such a configuration, voltage application and the like can be individually performed for the conductor layers 40 used as the word lines WL0 to WL7, the select gate lines SGS0 and SGD0, and the like through the respective contacts 70. Hereinafter, a part in which the conductor layers 40 are formed in a stair shape as described above to enable voltage application and the like for the conductor layers 40 in the stacking part 100 is also referred to as a "stair part 200". The stair part 200 is arranged alongside the stacking part 100 in the y direction. The y direction, in which the stair part 200 and the stacking part 100 are arranged, is a direction intersecting the z direction and corresponds to a "second direction" in the present embodiment.

As illustrated in FIG. 2, a plurality of support columns 60 extending in the z direction are formed in the stair part 200. Each support column 60 penetrates through the plurality of stacked conductor layers 40. The support columns 60 are provided to reinforce the plurality of insulator layers 30 at replacement to be described later when the semiconductor device 10 is manufactured. The support columns 60 are formed of, for example, oxide silicon.

A first insulating film 81 covers the stair part 200 from above. A second insulating film 82 covers part of the first insulating film 81 from above. A third insulating film 83 entirely covers the first insulating film 81, the second insulating film 82, and each stacking part 100 from above. Each contact 52, each wire 53, each contact 71, and each wire 72 described above are provided in the third insulating film 83.

The first insulating film 81 contains silicon and oxygen, and specifically, is a silicon oxide film. The second insulating film 82 contains silicon, oxygen, and carbon, and specifically, is a silicon oxide film containing hydrocarbon. The second insulating film 82 contains a larger amount of hydrocarbon than the first insulating film 81. The second insulating film 82 contains a larger amount of carbon atoms than the first insulating film 81. The second insulating film 82 contains a larger amount of hydrogen atoms than the first insulating film 81. In this manner, the first insulating film 81 and the second insulating film 82 are different from each other in material. In the above description, "contains a larger amount" means a larger contained amount per unit volume.

The thicknesses of the first insulating film 81 and the second insulating film 82 may be different from each other. The thicknesses of the first insulating film 81 and the second insulating film 82 may be set as appropriate based on the number of conductor layers 40 included in the stair part 200 or the distance from each stacking part 100. For example, the thickness of the first insulating film 81 may be larger than that of the second insulating film 82 as the distance from the stacking part 100 is shorter, and the thicknesses of the first insulating film 81 and the second insulating film 82 may be substantially equal to each other or the thickness of the second insulating film 82 may be larger than that of the first insulating film 81 as the distance from the stacking part 100 is longer.

In this manner, the circumference of the stair part 200, each contact 70, and each support column 60 is filled with the first insulating film 81 and the second insulating film 82. Any contact 70 provided at a position corresponding to the second insulating film 82 among the plurality of contacts 70 described above penetrates through both of the first insulating film 81 and the second insulating film 82 in the z direction. Any support column 60 provided at a position corresponding to the second insulating film 82 among the support columns 60 described above penetrates through the stair part 200, the first insulating film 81, and the second insulating film 82 in the z direction. The reason why an insulating film covering the stair part 200 and the like has a two-layer structure of upper and lower layers, namely, the first insulating film 81 and the second insulating film 82 will be described later.

The third insulating film 83 is a silicon oxide film. The third insulating film 83 may be, for example, a film made of a material same as that of the first insulating film 81.

For the purpose of description, conductor layers 40 denoted by reference signs "40A", "40B", and "40C" in FIG. 2 are also referred to as a "conductor layer 40A", a "conductor layer 40B", and a "conductor layer 40C" below, respectively. Among the plurality of contacts 70, a contact 70 connected with the conductor layer 40B is also referred to as a "contact 70B" below. In addition, among the plurality of contacts 70, a contact 70 connected with the conductor layer 40C is also referred to as a "contact 70C" below.

The conductor layer 40C is positioned on the negative z direction side of the conductor layer 40B, and thus the width of the conductor layer 40C in the y direction is larger than that of the conductor layer 40B. The conductor layer 40B corresponds to a "first conductor layer" in the present embodiment, and the conductor layer 40C corresponds to a "second conductor layer" in the present embodiment.

The contact 70B connected with the conductor layer 40B as the first conductor layer corresponds to a "first contact" in the present embodiment. The contact 70C connected with the conductor layer 40C as the second conductor layer corresponds to a "second contact" in the present embodiment. The length of the contact 70C in the z direction is longer than that of the contact 70B. In the z direction, the length of a part at which the contact 70C (second contact) penetrates through the second insulating film 82 is longer than that of a part at which the contact 70B (first contact) penetrates through the second insulating film 82.

An insulating film covering the stair part 200 from above, in other words, the insulating film made of the first insulating film 81 and the second insulating film 82 includes four parts denoted by reference signs "P1", "P2", "P3", and "P4" in FIG. 2. A part denoted by reference sign "P1" in the insulating film is also referred to as a "first part P1" below. Similarly, parts denoted by reference signs "P2", "P3", and "P4" in the insulating film are also referred to as a "second part P2", a "third part P3", and a "fourth part P4" below, respectively.

The first part P1 is a part to which the distance from the conductor layer 40C in the z direction is equal to a first distance. The second part P2 is a part to which the distance from the conductor layer 40C in the z direction is equal to a second distance longer than the first distance. The first part P1 is part of the first insulating film 81, and the second part P2 is part of the second insulating film 82. Thus, the concentration of carbon in the second part P2 is higher than that in the first part P1.

The third part P3 is a part to which the distance from the conductor layer 40A in the y direction is equal to a third distance. The fourth part P4 is a part to which the distance from the conductor layer 40A in the y direction is equal to a fourth distance longer than the third distance. The third part P3 is part of the first insulating film 81, and the fourth part P4 is part of the second insulating film 82. Thus, the concentration of carbon in the fourth part P4 is higher than that in the third part P3.

A method of manufacturing the semiconductor device 10 will be described below.

Stacking Process

Figure 4:
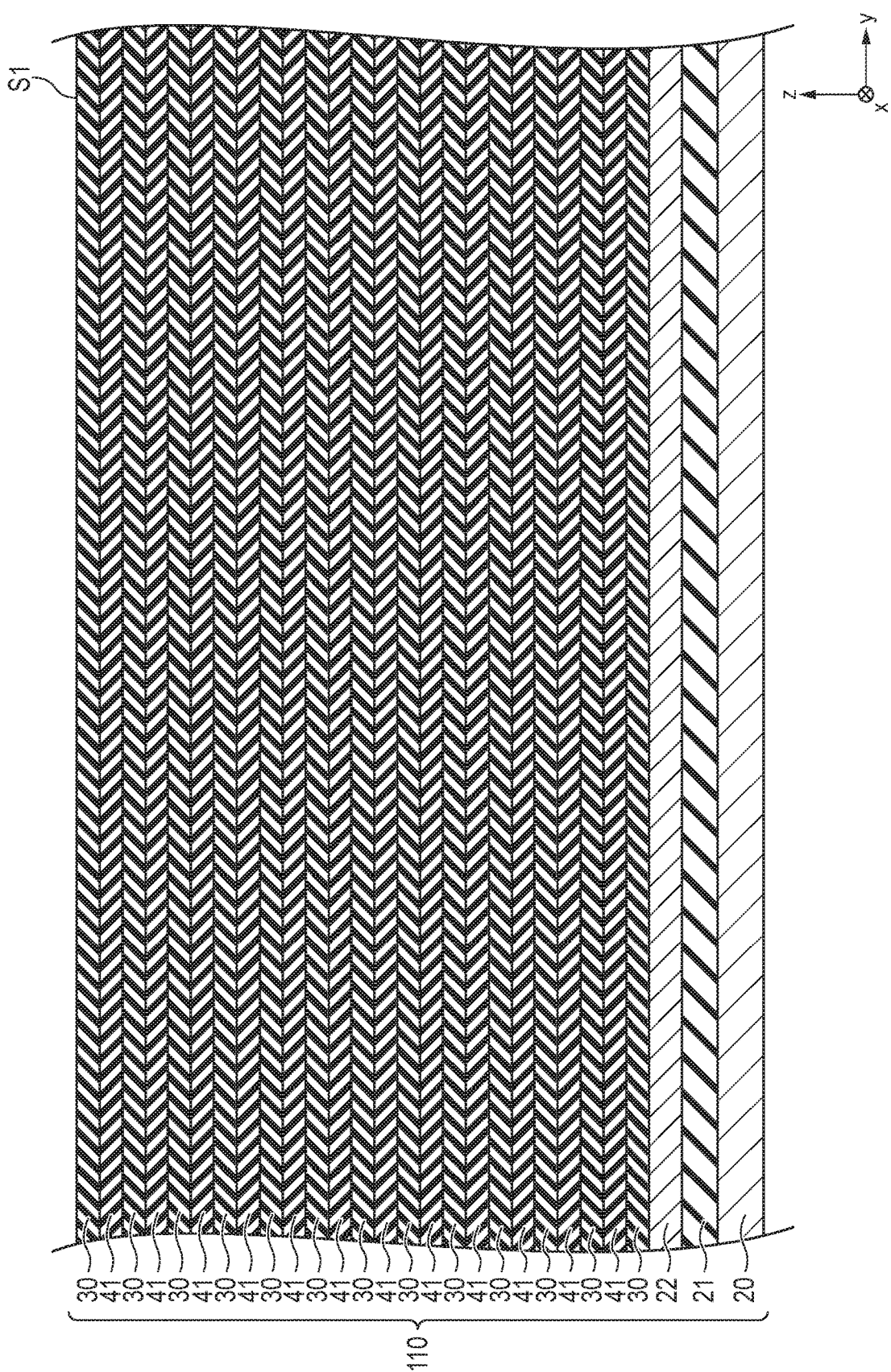
FIG. 4 is a diagram for illustrating a manufacturing method for the semiconductor device according to the present embodiment.

In a stacking process, first, peripheral circuits (not illustrated) are provided on the surface of the semiconductor substrate 20, and then the insulator layer 21 is formed covering the peripheral circuits from above, and the conductor layer 22 is formed covering the insulator layer 21 from above (the z direction side). Subsequently, insulator layers 30 and sacrificial layers 41 are alternately stacked in the z direction to cover the conductor layer 22 from above. The sacrificial layers 41 are to be replaced with conductor layers 40 in a later process and are formed of, for example, silicon nitride. FIG. 4 illustrates a state after the stacking process is completed.

The entire part in which the insulator layers 30 and the sacrificial layers 41 are alternately stacked is also referred to as a "stacked body 110" below. The surface of the stacked body 110 on the z direction side, in other words, the surface of the insulator layer 30 formed closest to the z direction side is also referred to as a "surface S1" below. The stacking process can be understood as the process of forming the stacked body 110 on the semiconductor substrate 20.

Stair-Part Formation Process

Figure 5:
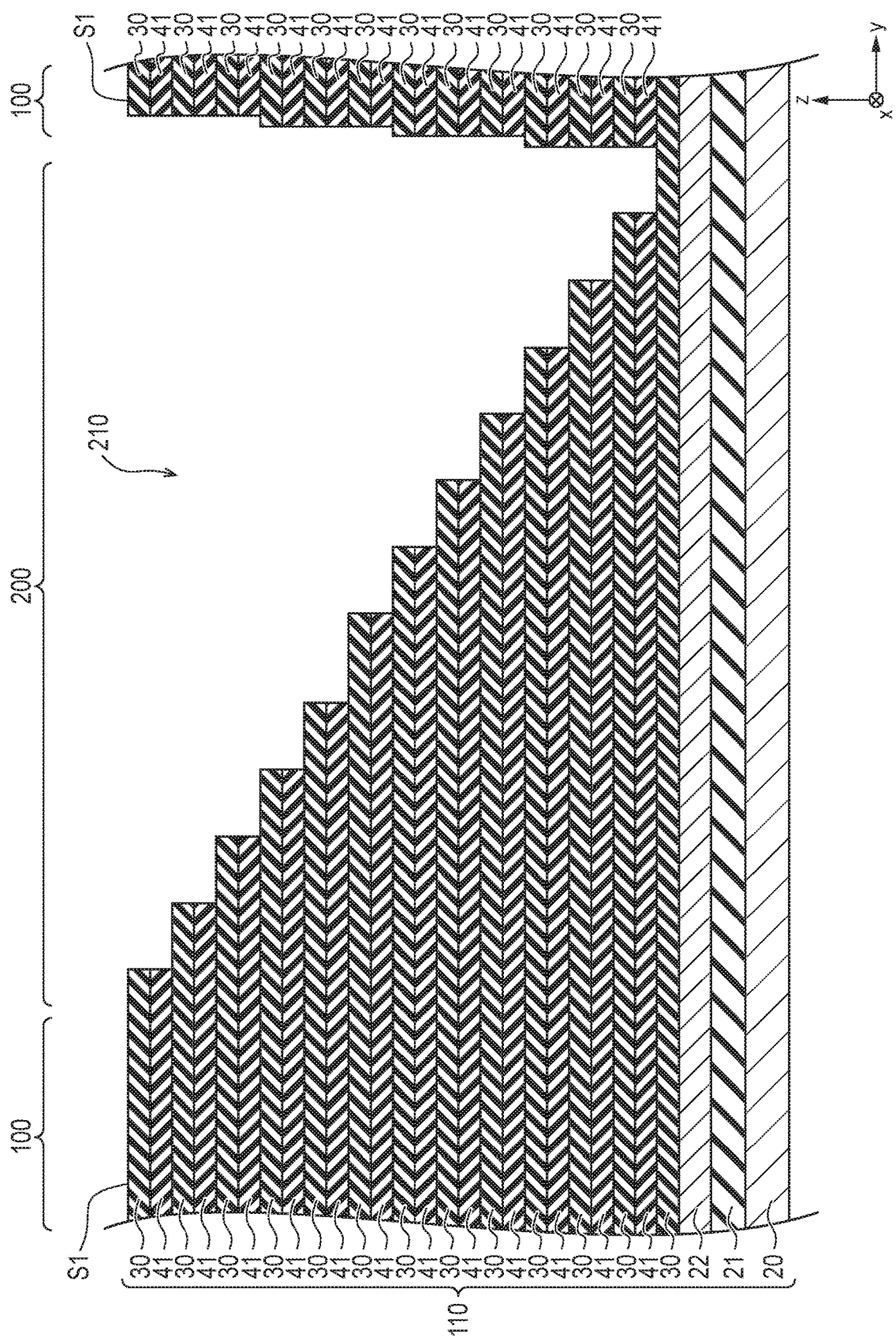
FIG. 5 is a diagram for illustrating the manufacturing method for the semiconductor device according to the present embodiment.

After the stacking process, a stair-part formation process is performed. In the stair-part formation process, anisotropic etching and etching mask slimming are repeated to form the stair part 200 at part of the insulator layers 30 and the sacrificial layers 41 thus stacked. FIG. 5 illustrates a state after the stair-part formation process is completed. As illustrated in FIG. 5, in the stacked body 110, a part remaining on the negative y direction side of the stair part 200 and a part remaining on the y direction side of the stair part 200 are parts that become stacking parts 100 through a process to be described later. The stair-part formation process can be understood as the process of forming the stair part 200 by fabricating part of the stacked body 110 into a stair shape. When the stair-part formation process is completed, a recess 210 retracted on the negative z direction side is formed as a result of etching part of the stacked body 110 as described above.

First-Insulating-Film Formation Process

Figure 6:
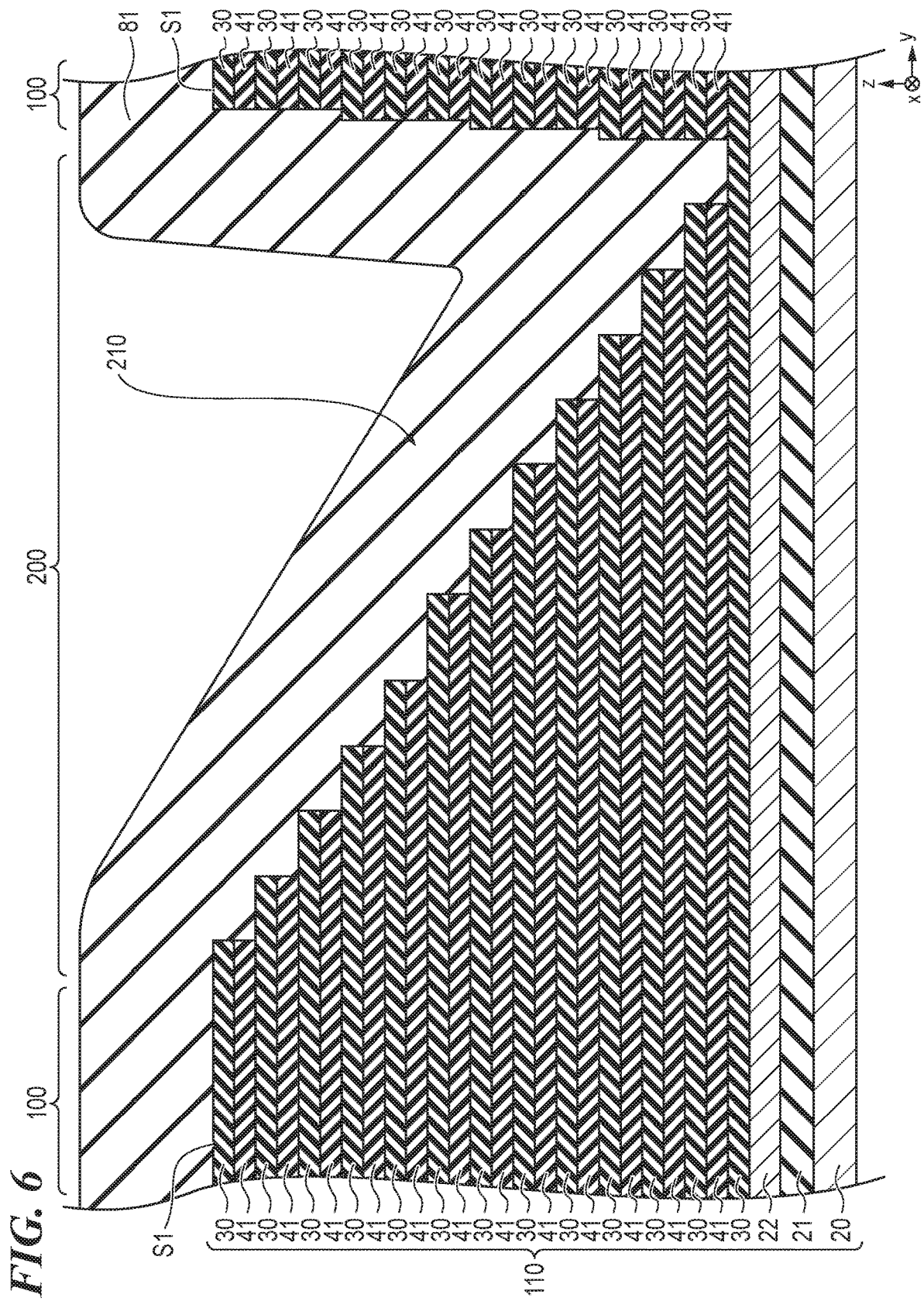
FIG. 6 is a diagram for illustrating the manufacturing method for the semiconductor device according to the present embodiment.

After the stair-part formation process, a first-insulating-film formation process is performed. In the first-insulating-film formation process, the first insulating film 81 is formed to entirely cover, from above, the stacked body 110 including the part in which the stair part 200 is formed. FIG. 6 illustrates a state after the first-insulating-film formation process is completed. As illustrated in FIG. 6, in the state in which the first-insulating-film formation process is completed, the first insulating film 81 partially has an upper surface lower than the upper surface of the stacked body 110.

The first insulating film 81 as a silicon oxide film is formed at a thickness of, for example, 10 um approximately through plasma CVD. As illustrated in FIG. 6, the first insulating film 81 reaches inside the recess 210, and part of the surface thereof reaches a position deeper than the surface S1 of the stacked body 110. The first-insulating-film formation process can be understood as the process of forming the first insulating film 81 that covers the stair part 200 from above.

When the first insulating film 81 is formed as a silicon oxide film as described above, for example, tetraethoxysilane and oxygen ($O_2$) are used as material gas in deposition. The material gas may be tetraethoxysilane and nitrogen monoxide ($N_2O$).

The material of the first insulating film 81 may be other than tetraethoxysilane. For example, monosilane ($SiH_4$) and nitrogen monoxide may be used as the material for forming the first insulating film 81 as a silicon oxide film.

Second-Insulating-Film Formation Process

Figure 7:
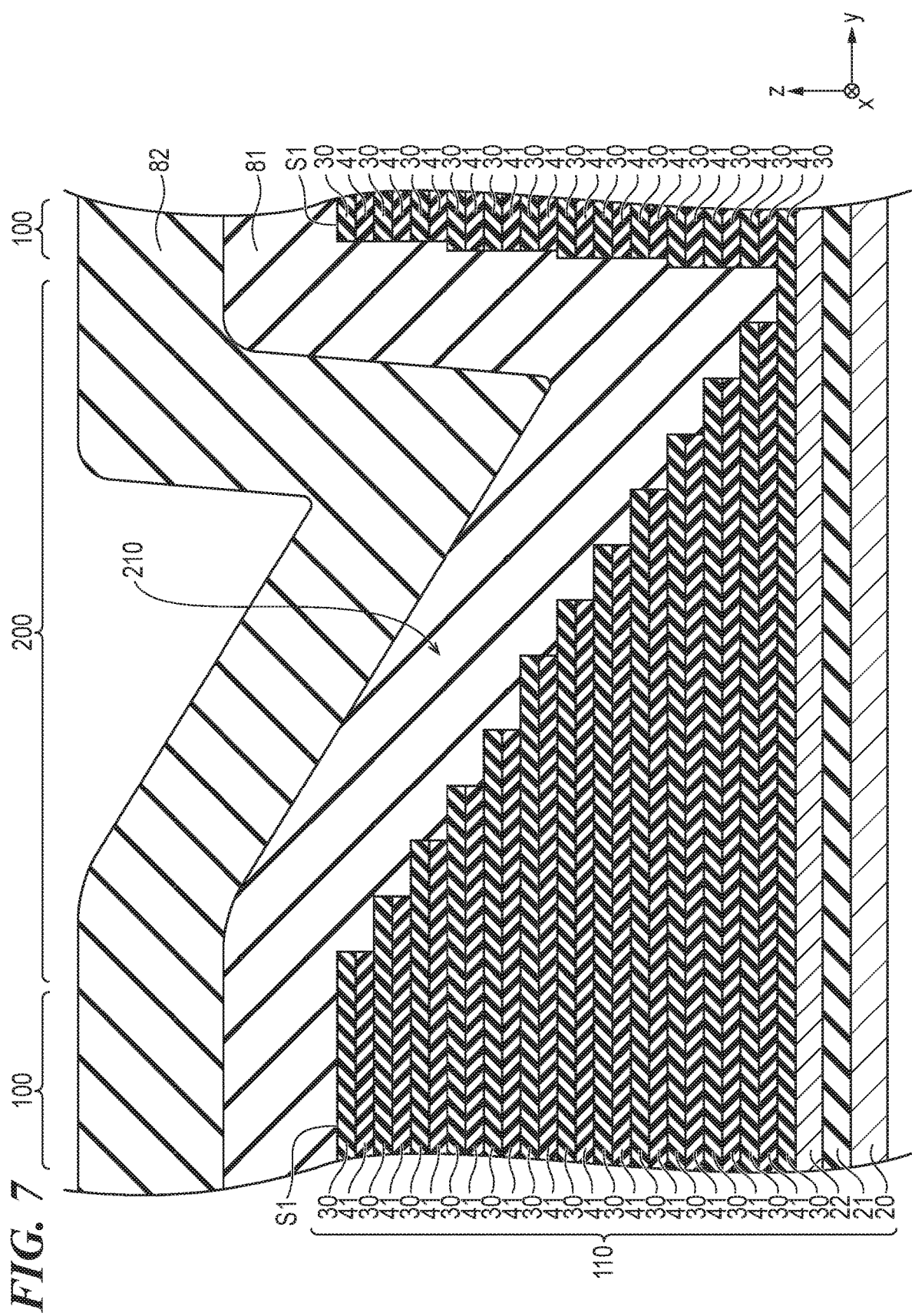
FIG. 7 is a diagram for illustrating the manufacturing method for the semiconductor device according to the present embodiment.

After the first-insulating-film formation process, a second-insulating-film formation process is performed. In the second-insulating-film formation process, the second insulating film 82 is formed to further cover, from above, the entire first insulating film 81 formed as described above. FIG. 7 illustrates a state after the second-insulating-film formation process is completed.

As described above, the second insulating film 82 is a silicon oxide film containing hydrocarbon (CHx). The second insulating film 82 is formed through plasma CVD. The material for performing plasma CVD is a material containing methyl radical ($CH_3$ radical), specifically, at least one of octamethylcyclotetrasiloxane (OMCTS), trimethylsilane ($C_3H_{10}Si$), and tetramethylsilane ($Si(CH_3)_4$). The second insulating film 82 is formed at a thickness of, for example, 10 um approximately. As illustrated in FIG. 7, the second insulating film 82 reaches inside the recess 210, and part thereof reaches a position deeper than the surface S1 of the stacked body 110. However, the height position of the surface of the second insulating film 82 at a deepest part is higher than the surface S1. The first-insulating-film formation process can be understood as the process of forming the second insulating film 82 that covers the first insulating film 81 from above.

Polishing Process

Figure 8:
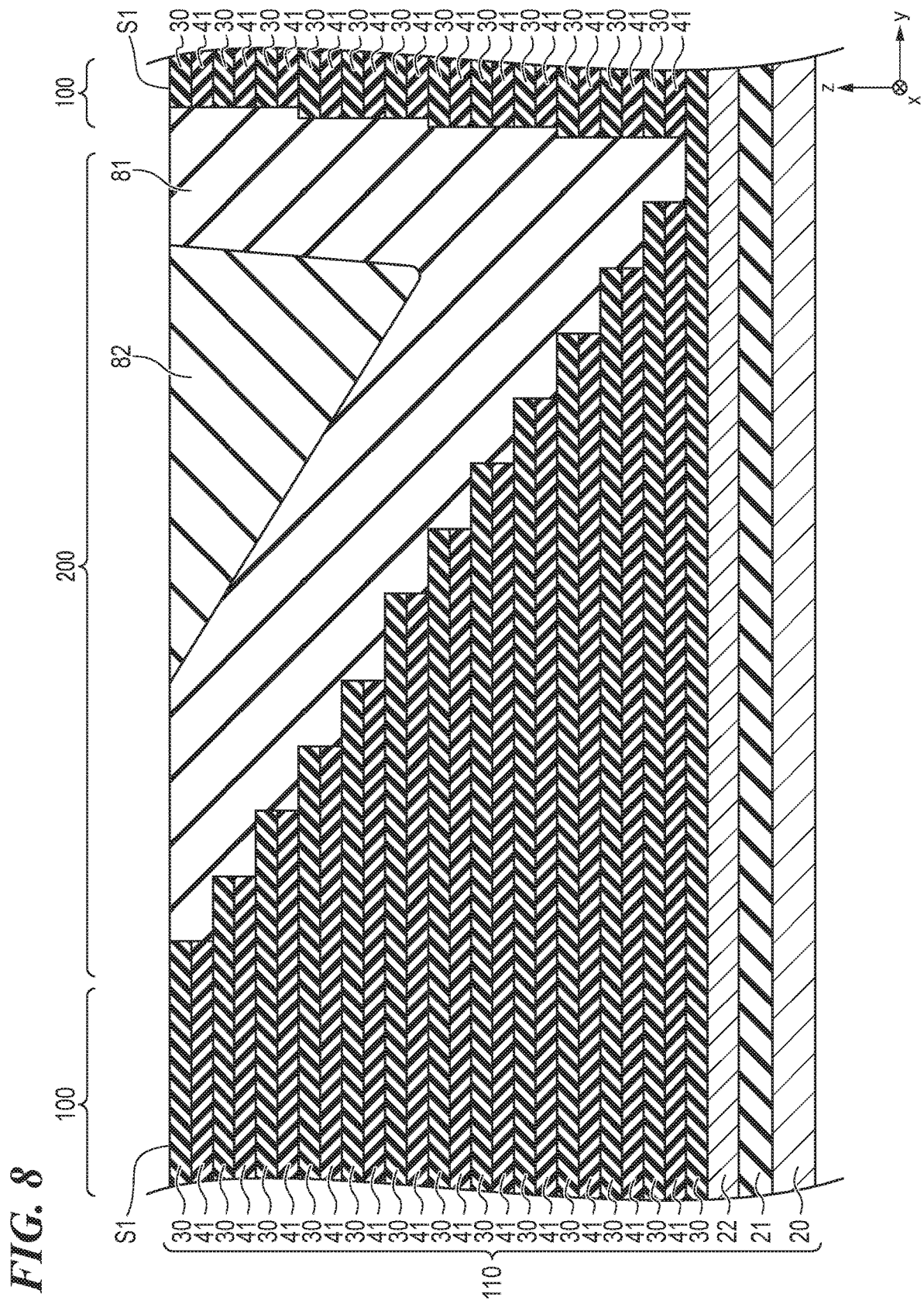
FIG. 8 is a diagram for illustrating the manufacturing method for the semiconductor device according to the present embodiment.

After the second-insulating-film formation process, a polishing process is performed. In the polishing process, the surface of the semiconductor substrate 20 on which the first insulating film 81 and the second insulating film 82 are formed as described above is polished through, for example, chemical mechanical polishing (CMP). Such polishing is performed, for example, until the surface S1 of the stacked body 110 is exposed. As a result, the first insulating film 81 and the second insulating film 82 substantially entirely covering the semiconductor substrate 20 from the upper side are removed except for a part reaching inside the recess 210. FIG. 8 illustrates a state after the polishing process is completed. In the state of FIG. 8, similarly to FIG. 2, the stair part 200 is covered by the first insulating film 81 from above, and part of the first insulating film 81 is covered by the second insulating film 82 from above.

MH Etc. Formation Process

Figure 9:
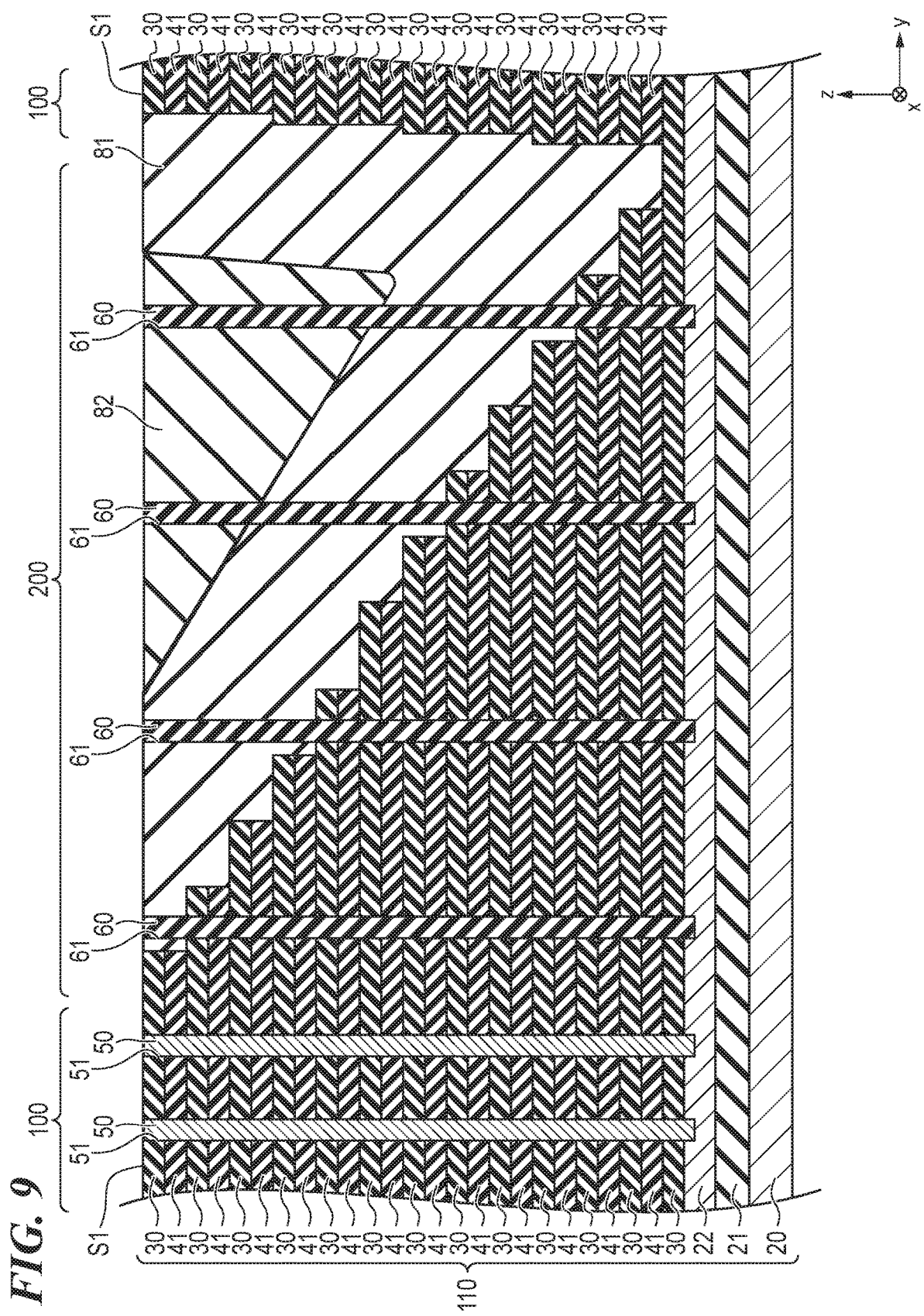
FIG. 9 is a diagram for illustrating the manufacturing method for the semiconductor device according to the present embodiment.

After the polishing process, an MH etc. formation process is performed. In the MH etc. formation process, in the stacked body 110, a hole 51 is formed at a part corresponding to each memory pillar 50, and a hole 61 is formed at a part corresponding to each support column 60. These holes are formed through reactive ion etching (RIE). Thereafter, the memory pillars 50 are formed inside the holes 51 by, for example, CVD. The support columns 60 are formed inside the holes 61 by, for example, CVD. FIG. 9 illustrates a state after the MH etc. formation process is completed.

After the MH etc. formation process is completed, each sacrificial layer 41 is replaced with a conductor layer 40. Specifically, the plurality of sacrificial layers 41 are removed by, for example, wet etching, and then the conductor layer 40 is formed at each removed part. Thereafter, a plurality of contacts 70 are formed in connection with the terrace parts of the respective conductor layers 40 in the stair part 200. In addition, the third insulating film 83, each contact 52, each wire 53, each contact 71, and each wire 72 are formed by various kinds of publicly known methods, and accordingly, the semiconductor device 10 having the configuration illustrated in FIG. 2 is completed.

The following describes the reason why the insulating film covering the stair part 200 and the like has a two-layer structure of upper and lower layers, namely, the first insulating film 81 and the second insulating film 82.

Figure 10A:
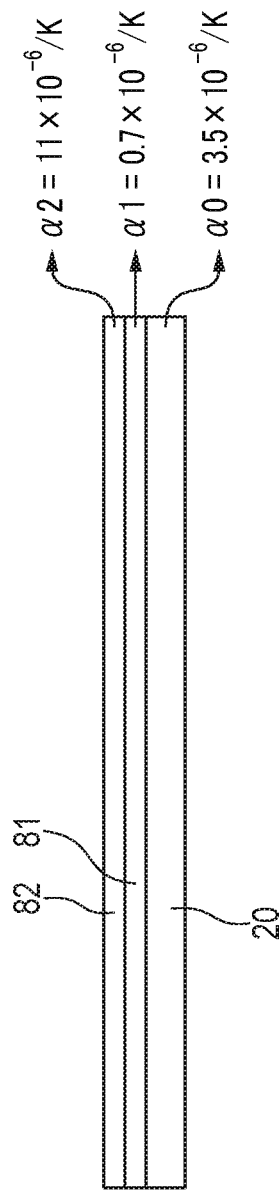
FIGS. 10A, 10B, and 10C are diagrams for description of semiconductor substrate warping.

FIG. 10A schematically illustrates the semiconductor substrate 20 in a state in which the second-insulating-film formation process is completed. In FIG. 10A, illustration of the stacked body 110 is omitted, and only the semiconductor substrate 20, the first insulating film 81, and the second insulating film 82 are illustrated.

As is well known, the entire temperature of the semiconductor substrate 20 or the like as a deposition target body becomes high when plasma CVD is performed. In this case, warping sometimes occurs to the entire semiconductor substrate 20 including the stacked body 110 (not illustrated) due to the difference in linear expansion coefficient between the semiconductor substrate 20 and the first insulating film 81 or the like formed thereon. Such warping of the semiconductor substrate 20 or the like occurs because, for example, the first insulating film 81 is formed on the semiconductor substrate 20 or the insulator layers 30 are formed as part of the stacked body 110. The warping of the entire semiconductor substrate 20 including the first insulating film 81, the stacked body 110, and the like is referred to as "the warping of the semiconductor substrate 20" below.

The value of the linear expansion coefficient of each component near 500 K (Kelvin) is exemplarily illustrated on the right side in FIG. 10. The linear expansion coefficient $\alpha 0$ of Si (silicon) of which the semiconductor substrate 20 is made is $3.5 \times 10^{-6}$/K approximately at 500 K. In addition, the linear expansion coefficient $\alpha 1$ of the first insulating film 81 is $0.7 \times 10^{-6}$/K approximately, and the linear expansion coefficient $\alpha 2$ of the second insulating film 82 is $11 \times 10^{-6}$/K approximately. As described above, the linear expansion coefficient α2 of the second insulating film 82 is larger than the linear expansion coefficient α1 of the first insulating film 81.

The following describes a semiconductor device 10 according to a comparative example in which the insulating film covering the stair part 200 includes only one layer, namely, the first insulating film 81.

Figure 10B:
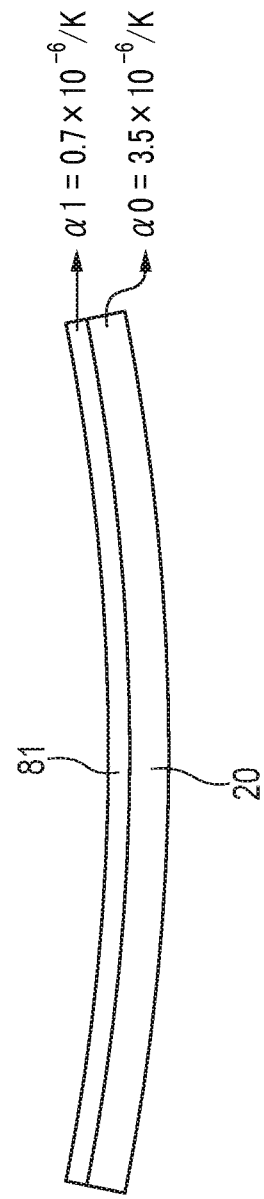

FIG. 10B is a diagram illustrating a state halfway through the only one first-insulating-film formation process in the comparative example, in other words, halfway through formation of the first insulating film 81 by a CVD apparatus. In the CVD apparatus, the entire temperature of a deposition target body including the semiconductor substrate 20 becomes high, for example, 425° C. In this case, internal stress occurs to the semiconductor substrate 20. With the above-described internal stress, the semiconductor substrate 20 warps in a concave shape as illustrated in FIG. 10B, which may make it difficult for the semiconductor substrate 20 to be chucked to the CVD apparatus.

Figure 10C:
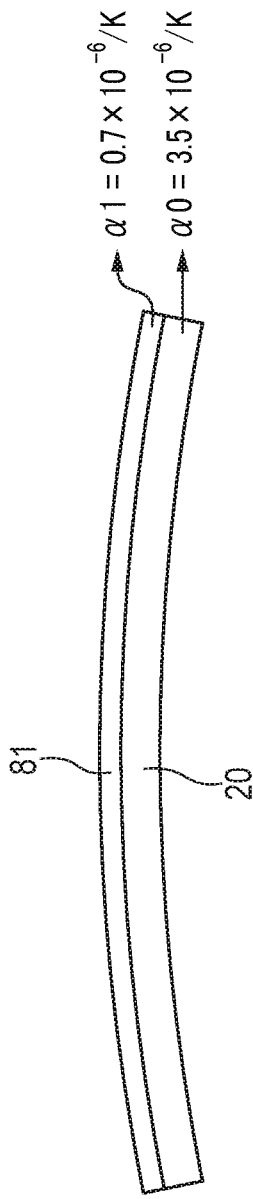

After the first-insulating-film formation process is completed, the temperature of the semiconductor substrate 20 on which the first insulating film 81 is formed decreases to room temperature (for example, 20° C.). In this case, warping in a convex shape occurs as illustrated in FIG. 10C because the semiconductor substrate 20 more largely contracts than the first insulating film 81.

In FIG. 11, G11 indicates the size of warping of the semiconductor substrate 20 in the state of FIG. 10B, in other words, the size of warping of the semiconductor substrate 20 when the first insulating film 81 is deposited by the CVD apparatus in the first-insulating-film formation process. In FIG. 11, G12 indicates the size of warping of the semiconductor substrate 20 in the state of FIG. 10C, in other words, the size of warping of the semiconductor substrate 20 at room temperature after the first-insulating-film formation process is completed. The "size of warping" is expressed as a numerical value obtained by subtracting the z coordinate of a central part of the semiconductor substrate 20 from the z coordinate of an outer peripheral part of the semiconductor substrate 20. Thus, the "size of warping" is positive when warping in a concave shape occurs as illustrated in FIG. 10B, and the "size of warping" is negative when warping in a convex shape occurs as illustrated FIG. 10C.

The size of warping of the semiconductor substrate 20 largely changes, for example, from 816 μm (G11) to −333 μm (G12) as the semiconductor substrate 20 returns to room temperature after the first-insulating-film formation process. This change amount of warping size is indicated by "dw1" in FIG. 11.

The size of warping in deposition, which is indicated by G11 in FIG. 11 can be adjusted as appropriate with parameters such as the flow rate and pressure of gas in the CVD apparatus and RF power. The change amount of warping size, which is indicated by dw1 is a substantially constant value determined by the material of the first insulating film 81 and the like, and cannot be adjusted with the above-described parameters.

The size of warping at room temperature, which is indicated by G12 remains after manufacturing, and thus preferably reduced as much as possible. However, since dw1 is substantially constant as described above, the parameters need to be adjusted to reduce the size of warping at room temperature, which is indicated by G12, by increasing the size of warping in deposition, which is indicated by G11. However, when the size of warping in deposition is excessively increased, chucking is potentially cancelled inside the CVD apparatus, which may interrupt deposition. The number of stacked conductor layers 40 has been recently increasing, and this is likely to further increase the size of warping in deposition, which is indicated by G11.

Thus, in the present embodiment, after the first-insulating-film formation process, the second-insulating-film formation process is performed to form the second insulating film 82 covering the first insulating film 81 from above. As illustrated in FIG. 10A, the linear expansion coefficient α2 of the second insulating film 82 is larger than the linear expansion coefficient α0 of the semiconductor substrate 20. When the second insulating film 82 containing such a material is formed, the size of warping of the semiconductor substrate 20, which occurs due to the difference between α0 and α1 can be reduced.

In FIG. 11, G21 indicates the size of warping of the semiconductor substrate 20 when the second insulating film 82 is deposited in the second-insulating-film formation process. In FIG. 11, G22 indicates the size of warping of the semiconductor substrate 20 at room temperature after the second-insulating-film formation process is completed.

The size of warping of the semiconductor substrate 20 changes, for example, from 365 μm (G21) to 142 μm (G22) as the semiconductor substrate 20 returns to room temperature after the second-insulating-film formation process. This change amount of warping size is indicated by "dw2" in FIG. 11.

As understood from comparison between G11 and G21, the size of warping of the semiconductor substrate 20 when deposition is performed is smaller with the configuration in which the second insulating film 82 is deposited (G21). In addition, as understood from comparison between dw1 and dw2, the change amount of warping after deposition is completed is smaller with the configuration in which the second insulating film 82 is deposited. This is because the balance of stress that occurs to the entire semiconductor substrate 20 is changed due to formation of the second insulating film 82 having a relatively large linear expansion coefficient.

The size (G22) of warping when the semiconductor substrate 20 returns to room temperature can be reduced by adjusting a parameter such as the flow rate of gas in the CVD apparatus so that the size of warping in deposition, which is indicated by G21 decreases. In FIG. 11, G31 indicates the size of warping of the semiconductor substrate 20 when the second insulating film 82 is deposited in the second-insulating-film formation process after such adjustment is performed. In FIG. 11, G32 indicates the size of warping of the semiconductor substrate 20 at room temperature after the second-insulating-film formation process is completed. The size of warping of the semiconductor substrate 20 is substantially 0 μm at room temperature after the size of warping (G31) in deposition is reduced to 231 μm approximately while dw2 is substantially maintained. When the second insulating film 82 is formed, the size of warping in deposition does not become excessively large even in a case in which deposition parameters are adjusted so that the size of warping at room temperature is 0 μm. Thus, it is possible to prevent a situation in which chucking cannot be performed in deposition and suppress the size of warping of the semiconductor substrate 20 at room temperature to substantially 0 μm.

The values of the size of warping illustrated in FIG. 11 are calculated in a simplified manner by using the values of the linear expansion coefficients of the materials of the semiconductor substrate 20 and the like at 500 K.

As a result of manufacturing by the above-described method, the semiconductor device 10 according to the present embodiment has a configuration including the stacking part 100 in which the plurality of conductor layers 40 are stacked in the z direction (first direction); the stair part 200 that is arranged alongside the stacking part 100 in the y direction (second direction) orthogonal to the z direction and in which the plurality of conductor layers 40 are extended in a stair shape in the y direction; the first insulating film 81 covering the stair part 200 from above; and the second insulating film 82 covering part of the first insulating film 81 from above. With such a configuration, it is possible to prevent warping of the semiconductor substrate 20.

Warping of the semiconductor substrate 20 can be prevented by initially forming the second insulating film 82 and thereafter forming the first insulating film 81. In other words, the stair part 200 can be directly covered by a silicon oxide film (the second insulating film 82) containing hydrocarbon (CHx). However, it is possible to ensure higher voltage resistance between the plurality of conductor layers 40 when the stair part 200 is directly covered by the first insulating film 81 that is highly adhesive to the conductor layers 40. Thus, it is preferable to initially form the first insulating film 81 and thereafter form the second insulating film 82 as in the present embodiment.

The range in which the first insulating film 81 is covered by the second insulating film 82 may be only part of the first insulating film 81 as in the present embodiment, but may be the entire first insulating film 81. The range in which the stair part 200 is covered by the first insulating film 81 may be only part of the stair part 200 as in the present embodiment but may be the entire stair part 200.

The linear expansion coefficients ($\alpha 0$, $\alpha 1$, and $\alpha 2$) indicated in FIG. 10 are merely exemplary. For example, the linear expansion coefficient $\alpha 2$ of the second insulating film 82 may be adjusted in accordance with the contained amount of hydrocarbon (doping amount of carbon). Thus, the linear expansion coefficient $\alpha 2$ may be adjusted as appropriate in accordance with, for example, the size of warping of the semiconductor substrate 20 in deposition.

Figure 12:
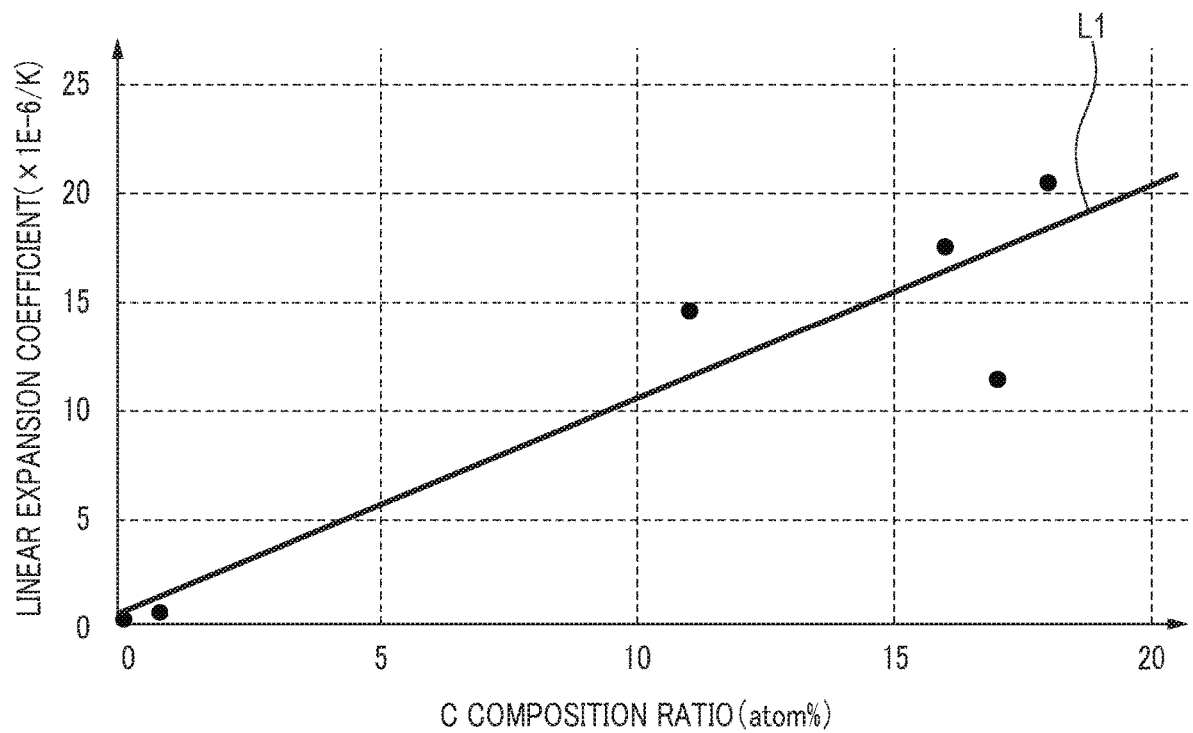
FIG. 12 is a diagram illustrating the relation between the contained amount of carbon in a second insulating film and the linear expansion coefficient thereof.

FIG. 12 illustrates a measured example of the relation between the contained amount of carbon in the second insulating film 82 (the horizontal axis) and the linear expansion coefficient of the second insulating film 82 near 500 K (the vertical axis). The above-described "contained amount of carbon" is the amount of carbon (C) contained in the second insulating film 82, which is expressed as a composition ratio (atom %) in the material of the second insulating film 82. In FIG. 12, line L1 is a first-order approximate line of individual data plotted in FIG. 12.

According to knowledge obtained by, for example, an experiment performed by the inventors, it is desirable that the linear expansion coefficient of the second insulating film 82 is larger than 2.6 ($\times 10^{-6}$/K) at room temperature and larger than 3.5 ($\times 10^{-6}$/K) at 500 K to sufficiently suppress the size of warping of the semiconductor substrate 20. Consideration of the data illustrated in FIG. 12 and measurement variation indicates that the amount of carbon contained in the second insulating film 82 is preferably equal to or larger than 4 atom % in the composition ratio to ensure the linear expansion coefficients as described above.

The above description is made on the example in which the first insulating film 81 is a silicon oxide film formed of tetraethoxysilane and the second insulating film 82 is a silicon oxide film containing hydrocarbon (CHx). The first insulating film 81 and the second insulating film 82 may be insulating films of kinds different from the above-described kinds. For example, the first insulating film 81 may be a silicon oxide film formed through CVD deposition using monosilane gas as a material. Alternatively, the second insulating film 82 may be a film formed of a material containing methyl radical ($CH_3$ radical) as a kind different from octamethylcyclotetrasiloxane (OMCTS). In any case, the linear expansion coefficient of the second insulating film 82 needs to be larger than that of the semiconductor substrate 20.

The values of the linear expansion coefficient of the semiconductor substrate 20 and the linear expansion coefficient of the second insulating film 82 can be each different from a value in the above-described example, depending on the temperature of the material, a measurement method, and the like. However, in any temperature range (including 500 Kelvin) included at least in the range of room temperature to a deposition temperature, it remains same that the linear expansion coefficient of the second insulating film 82 is larger that of the semiconductor substrate 20 and the linear expansion coefficient of the second insulating film 82 is larger than that of the first insulating film 81.

The configuration and manufacturing method of the semiconductor device 10 described above are applicable not only to semiconductor storage devices but also to various kinds of semiconductor devices.

The present embodiment is described above with reference to specific examples. However, the present disclosure is not limited to these specific examples. Any designing change made on these specific examples as appropriate by the skilled person in the art is included in the scope of the present disclosure as long as characteristics of the present disclosure are maintained. Each element included in each above-described specific example and its disposition, condition, shape, and the like are not limited to those exemplarily described but may be modified as appropriate. Combination of elements included in each above-described specific example may be changed as appropriate without technological inconsistency.

What is claimed is:

1. A semiconductor device comprising:
   a stacking part in which a plurality of conductor layers are separately stacked in a first direction;
   a stair part that is arranged alongside the stacking part in a second direction intersecting the first direction and in which the plurality of conductor layers are extended in the second direction in a stair shape;
   a first insulating film covering at least part of the stair part;
   a second insulating film covering at least part of the first insulating film and different from the first insulating film;
   a first contact connected with one of the plurality of conductor layers and penetrating through the first insulating film and the second insulating film; and
   a support column penetrating through each of the stair part, the first insulating film, and the second insulating film in the first direction,
   wherein:
   a linear expansion coefficient of the second insulating film is larger than a linear expansion coefficient of the first insulating film,
   the linear expansion coefficients are linear expansion coefficients at a temperature of 500 Kelvin, and
   a concentration of carbon contained in the second insulating film is equal to or higher than 4 atom %.

2. The semiconductor device according to claim 1, wherein
   the stacking part and the stair part are formed on a semiconductor substrate, and the linear expansion coefficient of the second insulating film is larger than a linear expansion coefficient of the semiconductor substrate.

3. The semiconductor device according to claim 2, wherein
the first insulating film contains silicon and oxygen, and
the second insulating film contains silicon, oxygen, and carbon and contains a larger amount of carbon than a contained amount of carbon in the first insulating film.

4. The semiconductor device according to claim 1, wherein
the plurality of conductor layers includes a first conductor layer and a second conductor layer having a width larger than a width of the first conductor layer in the second direction,
the first conductor layer is connected with the first contact, and
the second conductor layer is connected with a second contact having a length longer than a length of the first contact in the first direction.

5. The semiconductor device according to claim 4, wherein, in the first direction, a length of a part of the second insulating film through which the second contact penetrates is longer than a length of a part of the second insulating film through which the first contact penetrates.

6. A semiconductor device comprising:
a stacking part in which a plurality of conductor layers are separately stacked in a first direction;
a stair part that is arranged alongside the stacking part in a second direction intersecting the first direction and in which the plurality of conductor layers are extended in the second direction in a stair shape;
an insulating film covering at least part of the stair part;
a contact connected with one of the plurality of conductor layers and penetrating through the insulating film; and
a support column penetrating through each of the stair part and the insulating film in the first direction,
wherein
the insulating film includes a first part and a second part arranged along the first direction,
a first distance between the first part and one of the plurality of conductor layers in the first direction is shorter than a second distance between the second part and said one of the plurality of conductor layers in the first direction, whereby the first part of the insulating film is closer to said one of the plurality of conductor layers in the first direction than the second part of the insulating film,
a concentration of carbon in the second part is higher than a concentration of carbon in the first part,
the concentration of carbon contained in the second part of the insulating film is equal to or higher than 4 atom %,
a linear expansion coefficient of the second part of the insulating film is larger than a linear expansion coefficient of the first part of the insulating film, and
the linear expansion coefficients are linear expansion coefficients at a temperature of 500 Kelvin.

7. The semiconductor device according to claim 6, wherein
the insulating film includes a third part and a fourth part arranged along the second direction,
a third distance between the third part and another one of the plurality of conductor layers in the second direction is shorter than a fourth distance between the fourth part and said another one of the plurality of conductor layers in the second direction, whereby the third part of the insulating film is closer to said another one of the plurality of insulating layers in the second direction than the fourth part of the insulating film,
a concentration of carbon in the fourth part is higher than a concentration of carbon in the third part.

8. A semiconductor device manufacturing method comprising:
forming a stacked body on a semiconductor substrate;
forming a stair part by fabricating part of the stacked body into a stair shape;
forming a first insulating film covering the stair part from above and partially including an upper surface lower than an upper surface of the stacked body;
forming a second insulating film covering the first insulating film from above; and
forming a support column penetrating through each of the stair part, the first insulating film, and the second insulating film in the first direction,
wherein a linear expansion coefficient of the second insulating film is larger than a linear expansion coefficient of the first insulating film,
the linear expansion coefficients are linear expansion coefficients at a temperature of 500 Kelvin, and
a concentration of carbon contained in the second insulating film is equal to or higher than 4 atom %.

9. The semiconductor device manufacturing method according to claim 8, wherein
the first insulating film contains silicon and oxygen, and
the second insulating film contains silicon, oxygen, and carbon.

10. The semiconductor device manufacturing method according to claim 9, wherein the second insulating film is formed through plasma CVD using a material containing methyl radical.

11. The semiconductor device manufacturing method according to claim 10, wherein at least one of octamethylcyclotetrasiloxane, trimethylsilane, and tetramethylsilane is used as the material.

12. The semiconductor device manufacturing method according to claim 8, wherein
the stacked body is formed by alternately stacking a plurality of insulating layers and sacrificial layers in a first direction,
the plurality of sacrificial layers are removed after the formation of the second insulating film,
a plurality of conductor layers are formed where the plurality of sacrificial layers are removed, and
a contact is formed, the contact penetrating the first insulating film and the second insulating film in the first direction and connected with one of the plurality of conductor layers.

13. The semiconductor device manufacturing method according to claim 8, wherein a plurality of memory pillars penetrating through the stacked body are formed after the formation of the second insulating film.

* * * * *